(12) United States Patent
LiCausi et al.

(10) Patent No.: US 10,832,944 B2
(45) Date of Patent: Nov. 10, 2020

(54) INTERCONNECT STRUCTURE HAVING REDUCED RESISTANCE VARIATION AND METHOD OF FORMING SAME

(71) Applicant: GLOBALFOUNDRIES INC., Grand Cayman (KY)

(72) Inventors: Nicholas V. LiCausi, Watervliet, NY (US); Chanro Park, Clifton Park, NY (US); Ruilong Xie, Niskayuna, NY (US); Andre P. Labonte, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/177,854

(22) Filed: Nov. 1, 2018

(65) Prior Publication Data
US 2020/0144106 A1    May 7, 2020

(51) Int. Cl.
*H01L 21/768* (2006.01)

(52) U.S. Cl.
CPC .. *H01L 21/76804* (2013.01); *H01L 21/76831* (2013.01)

(58) Field of Classification Search
CPC ............... H01L 21/76804; H01L 21/76831
See application file for complete search history.

(56) References Cited

U.S. PATENT DOCUMENTS

| | | | |
|---|---|---|---|
| 9,576,901 B1 * | 2/2017 | Chen | H01L 23/53266 |
| 2009/0072400 A1 * | 3/2009 | Zhu | H01L 21/76816 257/751 |
| 2016/0049364 A1 | 2/2016 | Edelstein et al. | |

* cited by examiner

*Primary Examiner* — Timor Karimy
(74) *Attorney, Agent, or Firm* — Anthony Canale; Hoffman Warnick LLC (57) ABSTRACT

An interconnect structure of an integrated circuit and a method of forming the same, the interconnect structure including: at least two metal lines laterally spaced from one another in a dielectric layer, the metal lines having a top surface below a top surface of the dielectric layer; a hardmask layer on an upper portion of sidewalls of the metal lines, the hardmask layer having a portion extending between the metal lines, the extending portion being below the top surface of the metal lines; and at least one fully aligned via on the top surface of a given metal line.

18 Claims, 12 Drawing Sheets

INTERCONNECT STRUCTURE HAVING REDUCED RESISTANCE VARIATION AND METHOD OF FORMING SAME

TECHNICAL FIELD

The subject matter disclosed herein relates to an interconnect structure of an integrated circuit (IC) having reduced resistance variation. More specifically, various aspects described herein relate to an interconnect structure of an IC that includes a hardmask layer between metal lines and has reduced resistance variation, and method of forming the same.

BACKGROUND

As integrated circuits (ICs) continue to scale downward in size, transistors and interconnects have also had to become smaller and smaller. However, in scaled down sizes such as at the 7 nanometer (nm) technology node and beyond, scaling faces the so-called "RC challenge" (R=electrical resistance, C=capacitance). While transistor speeds continue to improve with scaling, the challenge for interconnect scaling is to not become a bottleneck and lose that performance improvement. Thus, the product of resistance and capacitance (RC) needs to remain low during interconnect scaling in order to create fast chips since device speed is inversely proportional to RC.

BRIEF SUMMARY

Interconnect structures including a hardmask layer between metal lines and having reduced resistance variation, and methods of forming the same are disclosed. In a first aspect of the disclosure, an interconnect structure includes: at least two metal lines laterally spaced from one another in a dielectric layer, the at least two metal lines having a top surface below a top surface of the dielectric layer; a hardmask layer on an upper portion of sidewalls of the at least two metal lines, the hardmask layer having a portion extending between the at least two metal lines, the extending portion being below the top surface of the metal lines; and at least one fully aligned via on the top surface of a given metal line of the at least two metal lines.

In a second aspect of the disclosure, a method of forming an interconnect structure includes: forming a metal line layer having at least two metal lines laterally spaced from one another in a first dielectric layer; recessing the first dielectric layer to have a top surface of the first dielectric layer below a top surface of the at least two metal lines; forming a hardmask layer on the top surface of the first dielectric layer, on sidewalls of the at least two metal lines exposed above the top surface of the first dielectric layer, and on the top surface of the at least two metal lines; depositing a second dielectric layer on the hardmask layer, the second dielectric layer having a top surface substantially coplanar with a top surface of the hardmask layer located on the top surface of the at least two metal lines; removing the hardmask layer located on the top surface of the at least two metal lines; and forming at least one fully aligned via on the top surface of a given metal line of the at least two metal lines.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to an interconnect structure of an integrated circuit (IC) having reduced resistance variation. More specifically, various aspects described herein relate to an interconnect structure of an IC that includes a hardmask layer between metal lines and has reduced resistance variation, and a method of forming the same.

As noted above, as conventional ICs continue to scale down (such as to the 7 nm technology node and beyond), interconnect scaling continues downward as well. However, as also noted above, one challenge for such interconnect scaling is to keep RC low so as to not hinder transistor speed improvement that comes along with scaling down. Various aspects of the disclosure include methods of forming interconnect structures which prevent degradation of resistance performance and thereby reduce variability of interconnect resistance, thus keeping interconnect RC low. In other aspects of the disclosure, interconnect structures are formed that have reduced resistance variation which in turn allows for low RC and improved device performance.

Figure 1:
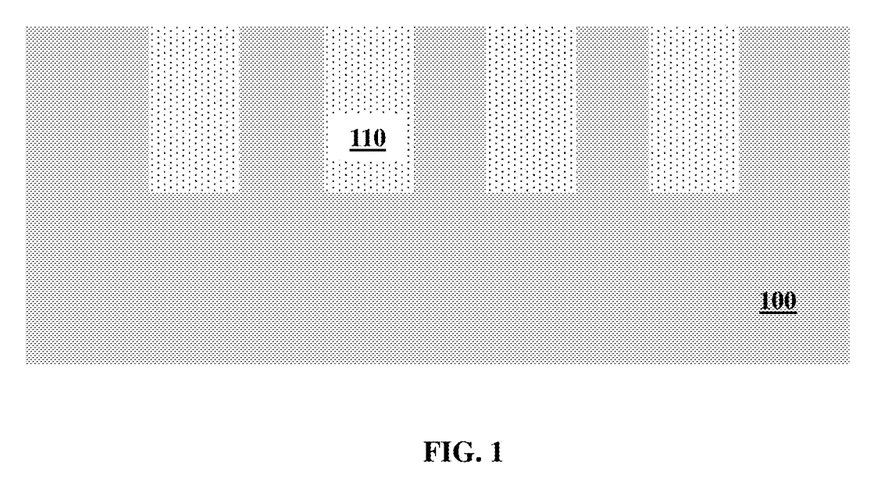
FIG. 1 shows a schematic cross-section of a metal line layer of an interconnect structure.

FIG. 1 depicts a schematic cross-section of a partial interconnect structure including at least two metal lines 110 laterally spaced from one another in a first dielectric layer 100. First dielectric layer 100 may include a first dielectric material such as, but not limited to, silicon dioxide ($SiO_2$), a low dielectric constant (<3.9) material ("low-k material"), or an ultra-low dielectric constant (<2.5) material ("ultra-low-k material"). The low-k and ultra-low k materials may be comprised of a combination of Si, O, C, N, and H. First dielectric layer 100 may be formed by any suitable semiconductor fabrication process. For example, first dielectric layer 100 may be formed by deposition. It is understood that first dielectric layer 100 may be formed over a large variety of integrated circuit (IC) structures, e.g., transistors, resistors, capacitors, etc. Metal lines 110 and fully aligned vias 1100, as described herein, may be used to electrically interconnect such IC structures.

As used herein, the term "depositing" or "deposition" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As shown in the cross-sectional view of FIG. 1, first dielectric layer 100 may include two or more spaced metal lines 110. Metal lines 110 may include a metal such as, but not limited to, copper (Cu), cobalt (Co), ruthenium (Ru) or tungsten (W). Metal lines 110 may be formed by any suitable semiconductor fabrication process. For example, metal lines 110 may be formed by forming trenches (not shown) in first dielectric layer 100 followed by filling of the trenches with metal by way of deposition and then planarizing a top surface thereof. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Any necessary liner and/or barrier material (not shown) may also be provided at the interface of metal lines 110 and first dielectric layer 100. The liner and barrier material may include a material such as, but not limited to, cobalt (Co), ruthenium (Ru), tantalum (Ta), tantalum nitride (TaN), and titanium nitride (TiN).

Figure 2:
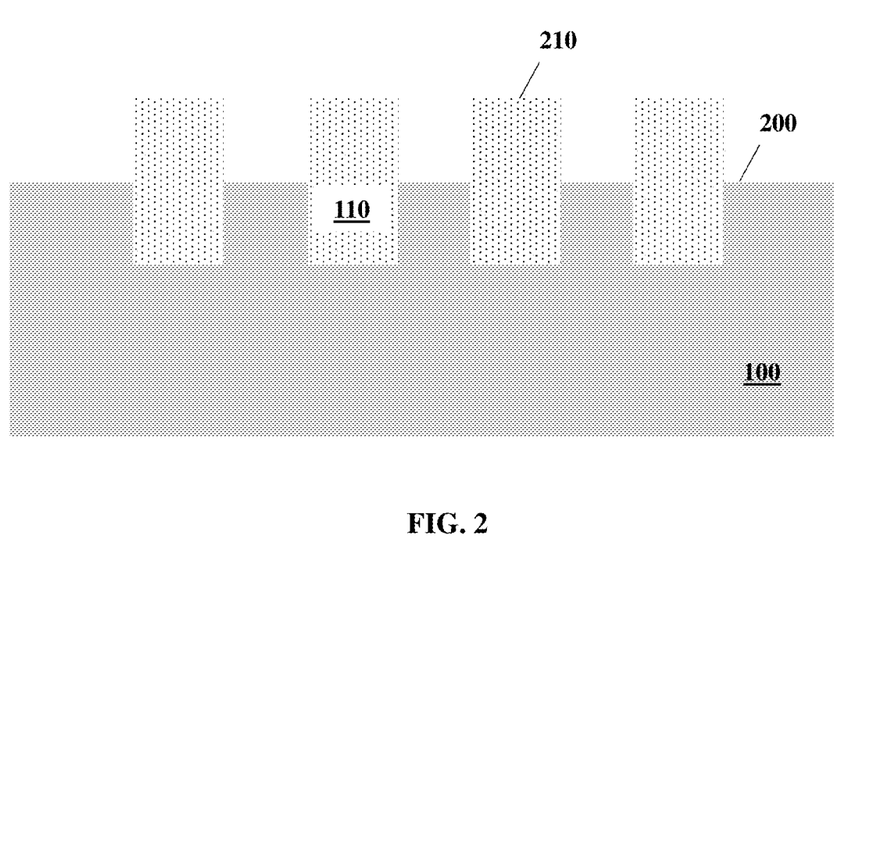
FIG. 2 shows a schematic cross-section of an interconnect structure after metal line reveal.

FIG. 2 depicts first dielectric layer 100 after recessing. The recessing of first dielectric layer 100 may be performed by any suitable semiconductor fabrication process, for example, by etching. In an embodiment wherein first dielectric layer 100 includes a low-k or ultra-low-k material, a form of etching called reactive-ion etching (RIE) (described below) may be preferable in order to minimize damage to first dielectric layer 100. As can be seen in FIG. 2, the noted recessing results in a top surface 200 of first dielectric layer 100 being below a top surface 210 of metal lines 110.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Figure 3:
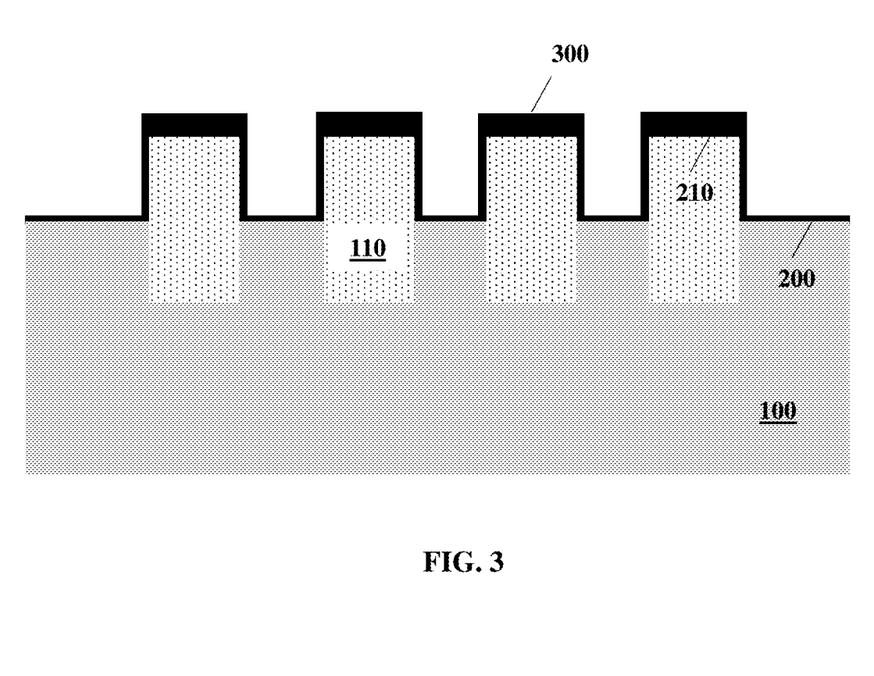
FIG. 3 shows a schematic cross-section of an interconnect structure after hardmask layer deposition.

FIG. 3 depicts formation of a hardmask layer 300 on top surface 200 of first dielectric layer 100, on sidewalls of metal lines 110 that are above top surface 200, and on top surface 210 of metal lines 110. As depicted in FIG. 3, hardmask layer 300 is semi-conformal in nature in that it mimics the profile of the structure thereunder but is not truly conformal since the thickness on top surface 210 of metal lines 110 is greater than the thickness on top surface 200 of first dielectric layer 100 and on sidewalls of metal lines 110. Hardmask layer 300 may include a material such as, but not limited to, silicon nitride (SiN), silicon dioxide ($SiO_2$), boron-doped silicon oxycarbonitride (SiOCBN), an aluminum oxide (e.g., AlO, $Al_2O$, $Al_2O_3$), or aluminum nitride (AlN). Hardmask layer 300 may be formed by any suitable semiconductor fabrication process. For example, hardmask layer 300 may be formed by deposition. A physical vapor deposition (PVD) technique may be utilized in the deposition of hardmask layer 300 since it is non-conformal by its nature, or a chemical vapor deposition (CVD) technique may be utilized so long as the processing parameter(s) (e.g., pressure) are tuned for non-conformality.

Figure 4:
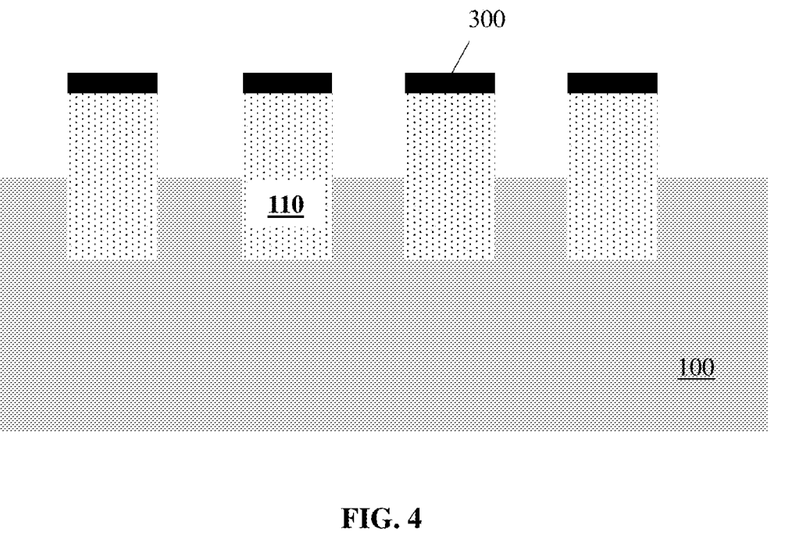
FIG. 4 shows an alternate schematic cross-section of an interconnect structure after hardmask layer formation followed by partial removal thereof (alternate to FIG. 3).

FIG. 4 depicts an alternate hardmask layer 300 embodiment to FIG. 3. In this alternate embodiment, hardmask layer 300 present on sidewalls of metal lines 110 and on top surface 200 of first dielectric layer 100 as shown in FIG. 3 is removed. Such removal of hardmask layer 300 as depicted in FIG. 4 may be accomplished by atomic layer etching wherein precise control of an etching target can be achieved. This alternative embodiment of FIG. 4 may be desirable when the k-value of hardmask layer 300 is higher than the k-value of first dielectric layer 100, and may be even more desirable when the k-value of hardmask layer 300 is greater than 4.0.

Moving forward through the figures, hardmask layer 300 as shown in FIG. 3 will be represented as the example embodiments in FIGS. 5-11. In any of FIGS. 5-11, hardmask layer 300 as depicted in FIG. 4 may replace hardmask layer 300 as shown.

Figure 5:
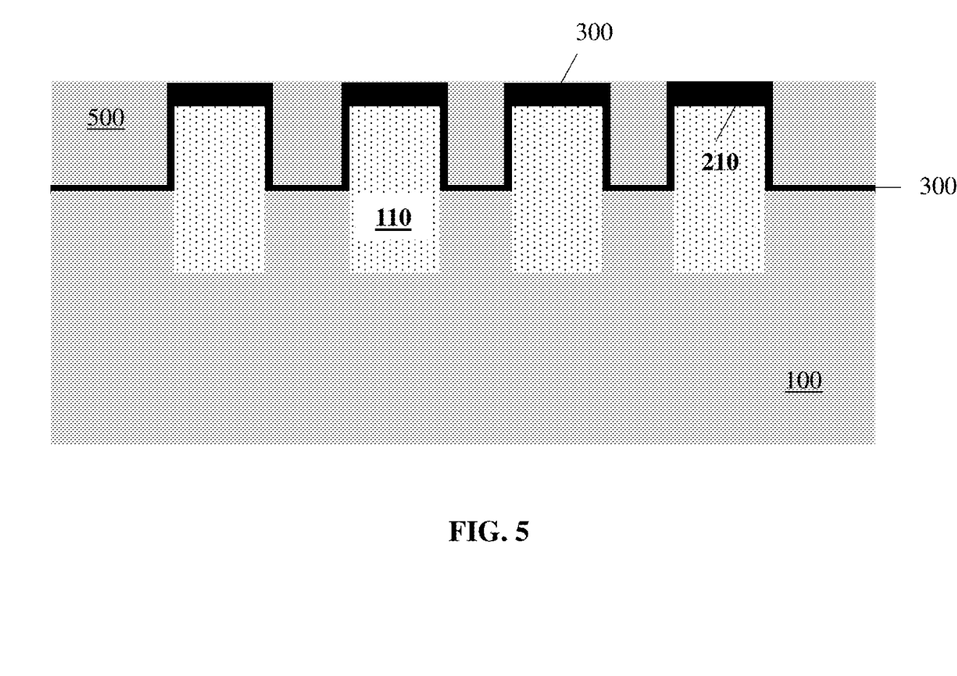
FIG. 5 shows a schematic cross-section of an interconnect structure after dielectric material deposition.

FIG. 5 depicts deposition of a second dielectric layer 500 on hardmask layer 300. The deposition of second dielectric layer 500 may include chemical vapor deposition (CVD) or flowable chemical vapor deposition (FCVD). The deposition of second dielectric layer 500 may be followed by planarization (e.g., CMP), if needed, to ensure the top surface of second dielectric layer 500 is substantially coplanar with the top surface of hardmask layer 300. Similar to the first dielectric layer 100, second dielectric layer 500 may include a second dielectric material such as, but not limited to, silicon dioxide ($SiO_2$), a low dielectric constant (<3.9) material ("low-k material"), or an ultra-low dielectric constant (<2.5) material ("ultra-low-k material"). The low-k and ultra-low k materials may be comprised of a combination of Si, O, C, N, and H. The second dielectric material of second dielectric layer 500 may be the same material as the first dielectric material of first dielectric layer 100.

Figure 6:
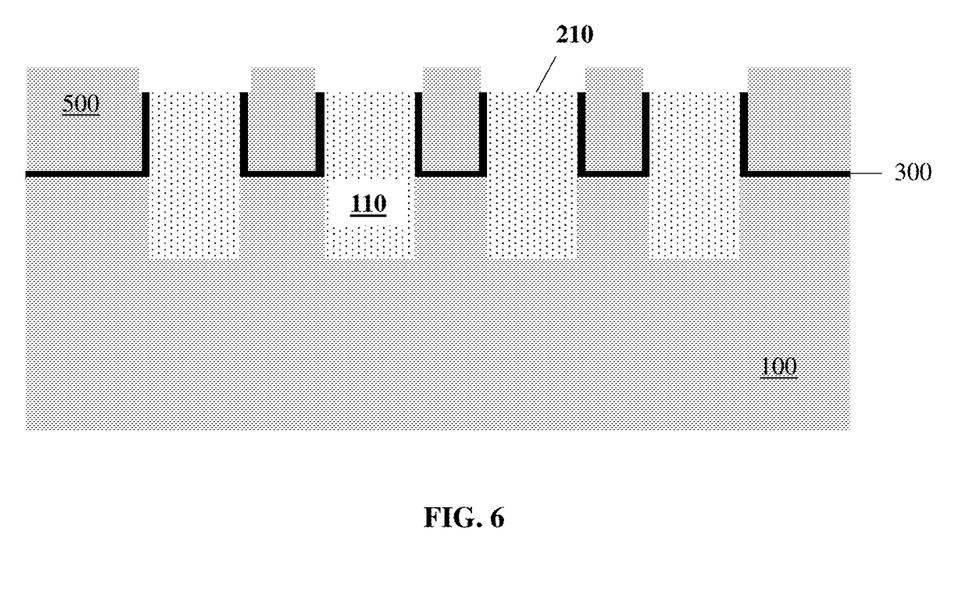
FIG. 6 shows a schematic cross-section of an interconnect structure after removal of the hardmask layer present on the top surface of the metal lines.

FIG. 6 depicts selective removal of hardmask layer 300 portions located on top surface 210 of metal lines 110 (see also, FIG. 5). The noted removal may be performed by wet etch or dry RIE of hardmask layer 300 material. This removal allows for a resulting structure with recessed metal lines 110 wherein top surface 210 of metal lines 110 is below the top surface of second dielectric layer 500. By forming the recessed metal lines 110 according to the disclosure, each top surface 210 of metal lines 110 are coplanar and uniformly flat which reduces the variability of interconnect resistance and capacitance. In contrast, conventional techniques of forming recessed metal lines, for instance, recessed copper lines, include directly recessing the top surface of the copper metal by wet etching. Such direct wet etching of the copper metal does not produce a uniformly flat top surface of the copper which in turn results in an undesirable variability of the ultimate interconnect resistance and capacitance and may also possibly damage the interconnect itself.

Figure 7:
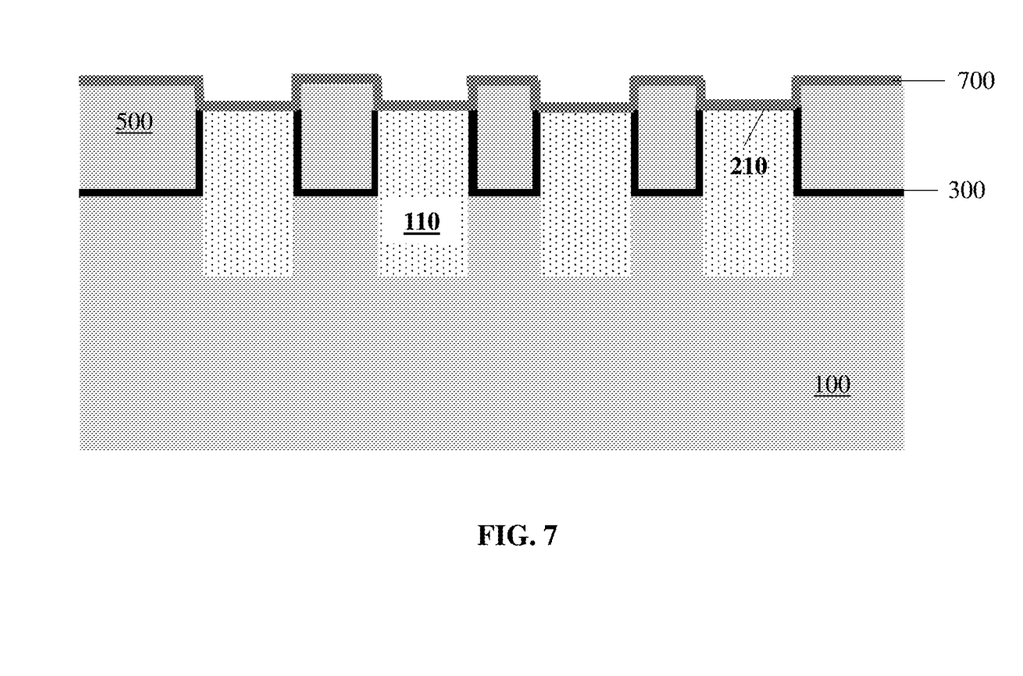
FIG. 7 shows a schematic cross-section of an interconnect structure after conformal etch stop layer formation.

FIG. 7 depicts formation of a conformal etch stop layer 700. Etch stop layer 700 may include a material such as, but not limited to, silicon carbonitride (SiCN), nitrogen-doped silicon carbide, aluminum nitride (AlN), or an aluminum oxide (e.g., AlO, $Al_2O$, $Al_2O_3$). Etch stop layer 700 may be formed by any suitable semiconductor fabrication process. For example, etch stop layer 700 may be formed by conformal deposition on exposed surfaces of second dielectric layer 500 (FIG. 6) and on each top surface 210 of metal lines 110. Etch stop layer 700 may include a single layer or etch stop layer 700 may include multiple layers including an optional conformal dielectric cap layer (not shown).

Figure 8:
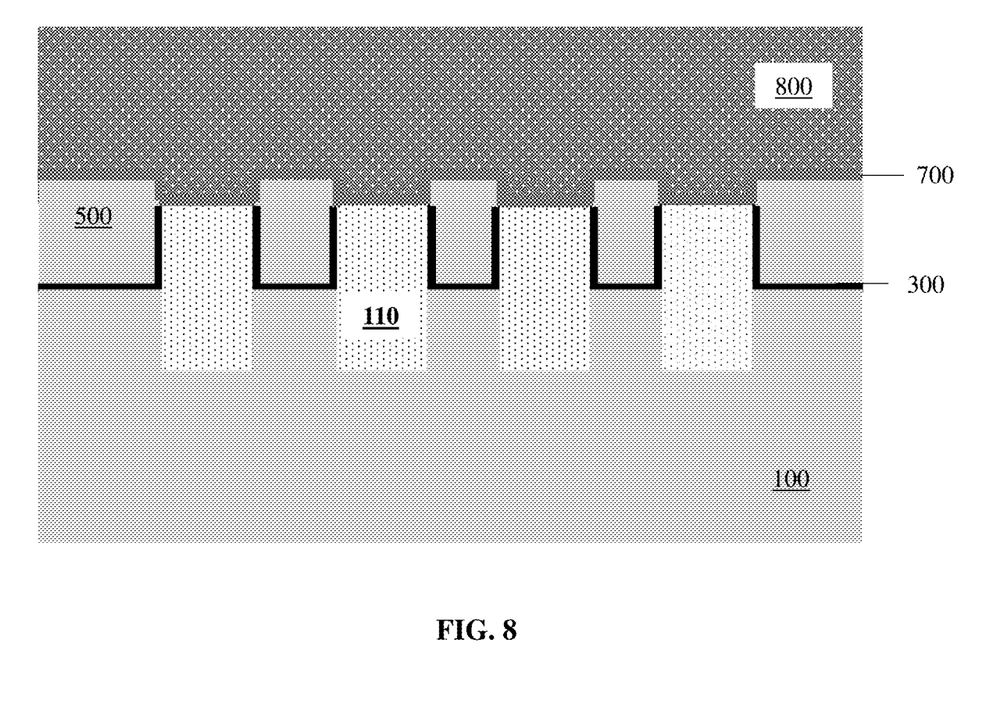
FIG. 8 shows a schematic cross-section of an interconnect structure after inter-layer dielectric (ILD) deposition.

FIG. 8 depicts formation of an inter-layer dielectric (ILD) 800 on etch stop layer 700. ILD 800 may be composed of any suitable low-k dielectric or isolation material, for example, $SiO_2$ or SiN, or a combination of low-k isolation/dielectric materials such as the combination of SiN and $SiO_2$. ILD 800 may be formed by any suitable semiconductor fabrication process. For instance, ILD 800 may be formed by deposition, for example, flowable CVD. ILD 800 may include the same material as first dielectric layer 100 and/or second dielectric layer 500.

Figure 9:
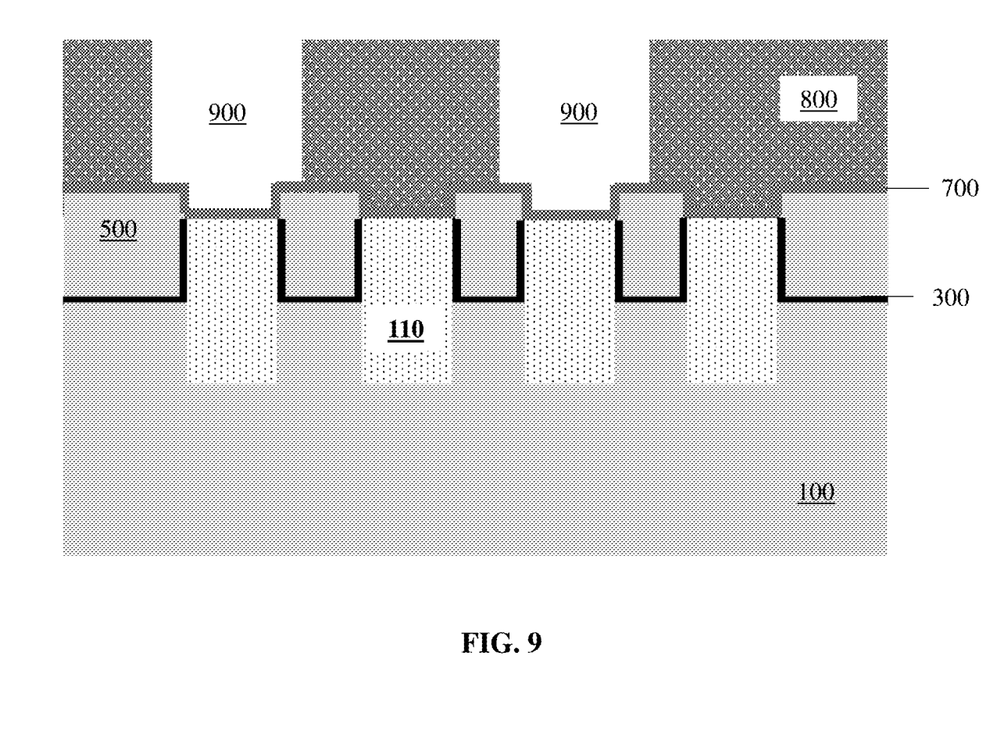
FIG. 9 shows a schematic cross-section of an interconnect structure after partial ILD removal.

FIG. 9 depicts removal of one or more portions of ILD 800 to form one or more corresponding via openings 900. More specifically and as depicted in FIG. 9, a portion of ILD 800 located above a given metal line 110 is removed and thereby forms a given via opening 900 over the given metal line 110. As shown in FIG. 9, the removal of the portion of ILD 800 to form the given via opening 900 results in exposure of a portion of etch stop layer 700 that is located under the given via opening 900. The removal of the one or more portions of ILD 800 may be performed by any suitable semiconductor fabrication process, for example, patterning a mask followed by etching, as is known in the art. Any necessary mask (not shown) may be employed to direct the etching. As shown in FIG. 9, the etching of the one or more portions of ILD 800 stops at etch stop layer 700 thereunder due to a difference in etch sensitivities between ILD 800 and etch stop layer 700.

Figure 10:
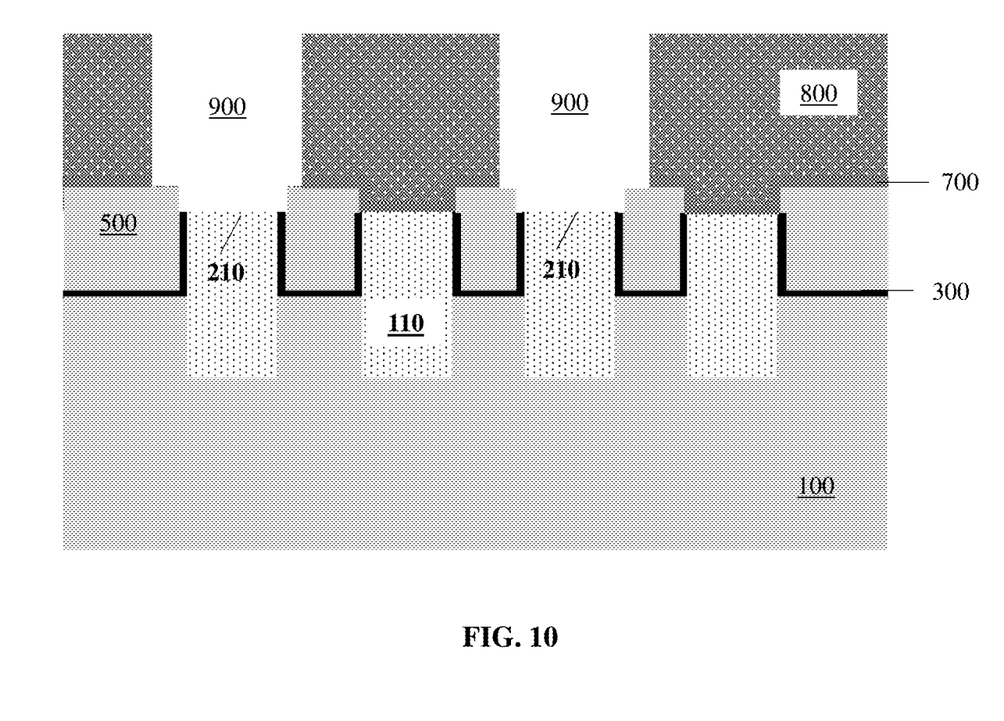
FIG. 10 shows a schematic cross-section of an interconnect structure after partial etch stop layer removal.
Figure 11:
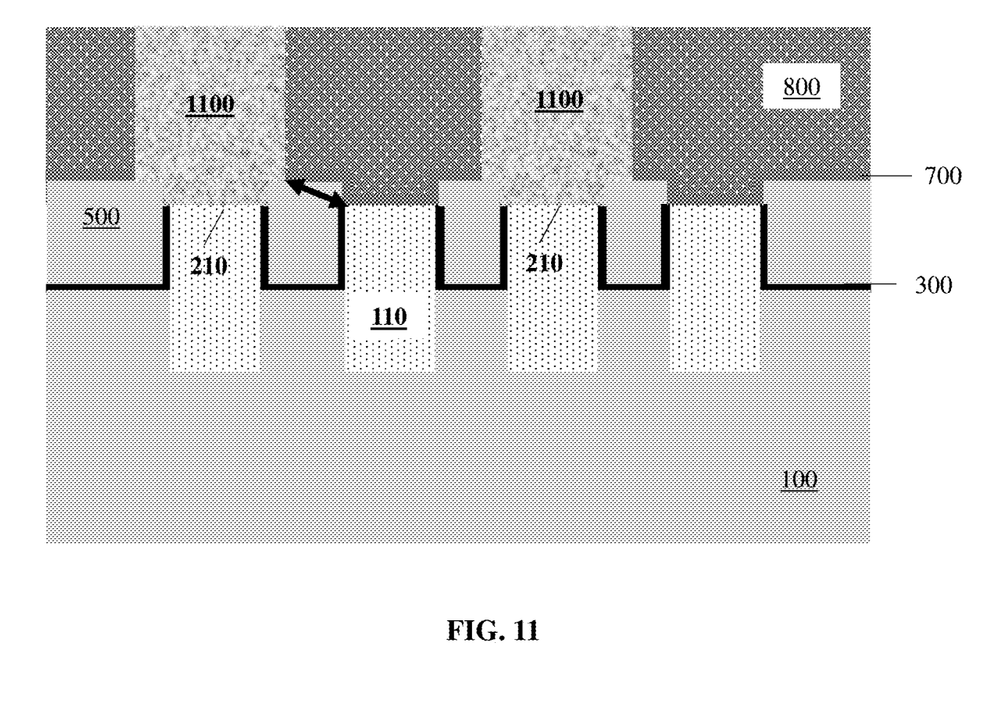
FIG. 11 shows a schematic cross-section of an interconnect structure after via formation.

FIG. 10 depicts etch stop layer 700 break-through. The exposed portions of etch stop layer 700 (FIG. 9) at the bottom of via openings 900 may be removed by wet etch or dry RIE. This removal of etch stop layer 700 located at the bottom of via openings 900 re-exposes the uniformly flat top surface 210 of metal line 110 thereunder in preparation for via formation thereover (FIG. 11). As shown in FIGS. 9 and 10, the etching of the one or more portions of ILD 800 is performed such that via opening 900 is wider than the given metal line 110 thereunder (FIG. 9) but does not extend into the second dielectric layer 500 during etch stop layer 700 break-through (FIG. 10).

FIG. 11 depicts forming a fully aligned via (FAV) 1100 in each via opening 900 (FIG. 10). FAV 1100 may be formed by any suitable semiconductor fabrication process. For instance, FAV 1100 may be formed by deposition of a metal such as, but not limited to, copper (Cu), cobalt (Co), ruthenium (Ru) and tungsten (W). Any necessary liner and/or barrier material (not shown) may also be provided, e.g., a refractory metal liner.

As shown in FIG. 11, each FAV 1100 is located directly on top surface 210 of a given metal line 110. As noted above, each top surface 210 of metal lines 110 is coplanar and uniformly flat, thus allowing for improved contact between a given metal line 110 and a given FAV 1100 which in turn allows for reduced variability of the resulting interconnect resistance and capacitance. Again, this reduced RC variability of interconnect structures of the disclosure is in contrast to conventional interconnect structure formation techniques that directly recess the top surface of the metal (e.g., Cu) lines by wet etch which fails to produce a uniformly flat top surface for the subsequent FAV formation thereon, resulting in undesirable variability of the ultimate interconnect resistance and capacitance.

In addition, and as shown in FIG. 11, each FAV 1100 is wider than a given metal line 110 thereunder but does not extend into second dielectric layer 500, thus having a shape with an elevated overhang (i.e., a portion of FAV 1100 extending over part of second portion 500). This overhang-like topography at the bottom portions of FAVs 1100 allow for a needed distance between a given FAV 1100 and an adjacent metal line 110 (see double headed arrow) in order to prevent electrical shorting and maintain reliability of the device. This shorting/reliability benefit is in addition to the above-described benefit of reduced variability of the interconnect resistance and capacitance of the interconnect structures of the disclosure.

Figure 12:
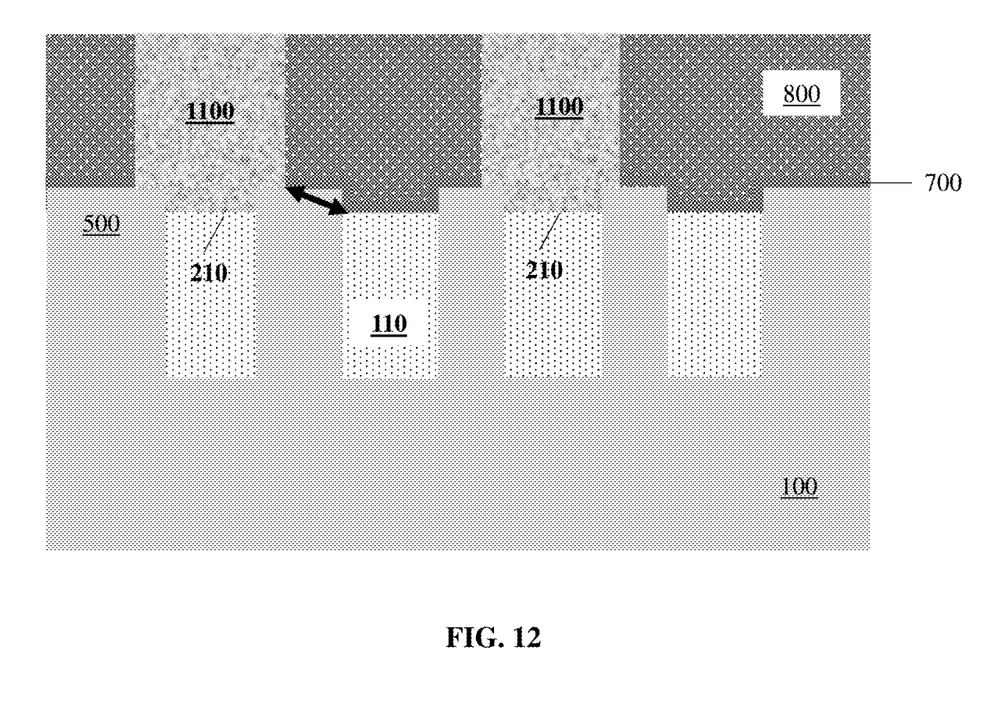
FIG. 12 shows a schematic cross-section of an alternate interconnect structure (alternate to FIG. 11).

FIG. 12 depicts an alternate embodiment to FIG. 11. In this alternate embodiment, hardmask layer 300 is not present on sidewalls of metal lines 110 and on top surface 200 of first dielectric layer 100 as shown in FIG. 11. The alternate embodiment of FIG. 12 flows from the alternate embodiment of FIG. 4 discussed above. In other words, if the process of the disclosure as described with reference to FIGS. 5-11 were performed utilizing the alternate embodiment of FIG. 4 (rather than FIG. 3), FIG. 12 would be the result thereof (rather than FIG. 11). The alternate embodiment of FIG. 12 shares all of the above-discussed benefits with the embodiment of FIG. 11 since FAVs 1100 of FIG. 12 have the same overhang-like topography as FAVs 1100 of FIG. 11, and since each top surface 210 of metal lines 110 in FIG. 12 is coplanar and uniformly flat like that of FIG. 11 due to the same protection afforded by hardmask layer 300 present on each top surface 210 of metal lines 110.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An interconnect structure of an integrated circuit, the interconnect structure comprising:
    at least two metal lines laterally spaced from one another in a dielectric layer, the at least two metal lines having a top surface below a top surface of the dielectric layer;
    a hardmask layer on an upper portion of sidewalls of the at least two metal lines, the hardmask layer having a portion extending between the at least two metal lines, the extending portion being below the top surface of the metal lines;
    at least one fully aligned via on the top surface of a given metal line of the at least two metal lines; and
    an etch stop layer having a first portion directly on the dielectric layer and a second portion directly on any portion of the at least two metal lines not having the at least one fully aligned via thereon, and surrounding the at least one fully aligned via.

2. The interconnect structure of claim 1, further comprising:
    an inter-layer dielectric (ILD) over the etch stop layer, the dielectric layer and the any portion of the at least two metal lines not having a via thereon, and surrounding the at least one fully aligned via.

3. The interconnect structure of claim 1, wherein the at least one fully aligned via is wider than the given metal line thereunder.

4. The interconnect structure of claim 1, wherein the dielectric layer includes a first dielectric layer below the hardmask layer portion extending between the at least two metal lines, and a second dielectric layer above the hardmask layer portion extending between the at least two metal lines.

5. The interconnect structure of claim 4, wherein the first dielectric layer includes a first dielectric material and the second dielectric layer includes a second dielectric material, the first and second dielectric materials being different.

6. The interconnect structure of claim 1, wherein the top surface of each of the at least two metal lines are coplanar and flat.

7. The interconnect structure of claim 1, wherein the hardmask layer includes a dielectric material including silicon nitride (SiN), silicon dioxide ($SiO_2$), boron-doped silicon oxycarbonitride (SiOCBN), an aluminum oxide, or aluminum nitride (AlN).

8. The interconnect structure of claim 1, wherein the at least two metal lines include copper.

9. An interconnect structure of an integrated circuit, the interconnect structure comprising:
    a dielectric layer;
    a pair of metal lines laterally spaced from one another within the dielectric layer, wherein each of the pair of metal lines includes a top surface below a top surface of the dielectric layer, and wherein the top surface of each of the pair of metal lines is coplanar and flat;
    a hardmask layer on an upper portion of a sidewall of each of the pair of metal lines, the hardmask layer having a portion extending between the pair of metal lines and below the top surface of the metal lines;
    at least one fully aligned via on the top surface of one of the pair of metal lines, wherein the at least one fully aligned via is wider than the one of the pair of metal lines; and
    an etch stop layer having a first portion directly on the dielectric layer and a second portion directly on any portion of the at least two metal lines not having the at least one fully aligned via thereon, and surrounding the at least one fully aligned via.

10. The interconnect structure of claim 9, further comprising:
    an inter-layer dielectric (ILD) over the etch stop layer, the dielectric and any portion of the pair of metal lines not having a via thereon, and surrounding the at least one fully aligned via.

11. The interconnect structure of claim 9, wherein the dielectric layer includes a first dielectric layer below the hardmask layer portion extending between the pair of metal lines, and a second dielectric layer above the hardmask layer portion extending between the pair of metal lines.

12. The interconnect structure of claim 11, wherein the first dielectric layer includes a first dielectric material and the second dielectric layer includes a second dielectric material, the first and second dielectric materials being different.

13. The interconnect structure of claim 9, wherein the hardmask layer includes a dielectric material including silicon nitride (SiN), silicon dioxide ($SiO_2$), boron-doped silicon oxycarbonitride (SiOCBN), an aluminum oxide, or aluminum nitride (AlN).

14. The interconnect structure of claim 9, wherein each of the pair of metal lines includes copper.

15. An interconnect structure of an integrated circuit, the interconnect structure comprising:
    a dielectric layer;
    a pair of metal lines laterally spaced from one another within the dielectric layer, wherein each of the pair of metal lines includes a top surface below a top surface of the dielectric layer, and wherein the top surface of each of the pair of metal lines is coplanar and flat;

a hardmask layer on an upper portion of a sidewall of each of the pair of metal lines, the hardmask layer having a portion extending between the pair of metal lines and below the top surface of the metal lines;

at least one fully aligned via on the top surface of one of the pair of metal lines, wherein the at least one fully aligned via is wider than the one of the pair of metal lines;

an inter-layer dielectric (ILD) over the dielectric layer, over any portion of the pair of metal lines not having a via thereon, and surrounding the at least one fully aligned via; and an etch stop layer between the ILD and the dielectric layer and between the ILD and the any portion of the pair of metal lines not having a via thereon.

16. The interconnect structure of claim 15, wherein the dielectric layer includes a first dielectric layer below the hardmask layer portion extending between the pair of metal lines, and a second dielectric layer above the hardmask layer portion extending between the pair of metal lines.

17. The interconnect structure of claim 16, wherein the first dielectric layer includes a first dielectric material and the second dielectric layer includes a second dielectric material, the first and second dielectric materials being different.

18. The interconnect structure of claim 15, wherein the hardmask layer includes a dielectric material including silicon nitride (SiN), silicon dioxide ($SiO_2$), boron-doped silicon oxycarbonitride (SiOCBN), an aluminum oxide, or aluminum nitride (AlN).

* * * * *